United States Patent
Kang et al.

(10) Patent No.: US 10,840,966 B2
(45) Date of Patent: Nov. 17, 2020

(54) WIRELESS DEVICE

(71) Applicant: LG ELECTRONICS INC., Seoul (KR)

(72) Inventors: Younghee Kang, Seoul (KR); Seokhwan Lee, Seoul (KR); Hosik Jeon, Seoul (KR); Kyungho Lim, Seoul (KR); Woonki Hur, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 95 days.

(21) Appl. No.: 15/737,262

(22) PCT Filed: Feb. 29, 2016

(86) PCT No.: PCT/KR2016/002033
§ 371 (c)(1),
(2) Date: Dec. 15, 2017

(87) PCT Pub. No.: WO2016/204377
PCT Pub. Date: Dec. 22, 2016

(65) Prior Publication Data
US 2018/0159583 A1    Jun. 7, 2018

(30) Foreign Application Priority Data
Jun. 18, 2015    (KR) .................. 10-2015-0086569

(51) Int. Cl.
*H04B 1/52*    (2015.01)
*H03H 7/46*    (2006.01)
(Continued)

(52) U.S. Cl.
CPC .............. *H04B 1/52* (2013.01); *H03H 7/465* (2013.01); *H04B 1/006* (2013.01); *H04B 1/0057* (2013.01);
(Continued)

(58) Field of Classification Search
CPC ...... H03H 7/465; H04B 1/0057; H04B 1/006; H04B 1/52; H04L 5/001; H04W 72/0453
(Continued)

(56) References Cited

U.S. PATENT DOCUMENTS

| | | | |
|---|---|---|---|
| 2009/0129218 A1* | 5/2009 | Kitaoka | G11B 7/0941 369/44.32 |
| 2012/0282872 A1* | 11/2012 | Banwell | H04B 1/58 455/269 |

(Continued)

FOREIGN PATENT DOCUMENTS

| | | |
|---|---|---|
| JP | 2003078441 | 3/2003 |
| KR | 100691134 | 3/2007 |

(Continued)

OTHER PUBLICATIONS

PCT International Application No. PCT/KR2016/002033, Written Opinion of the International Searching Authority dated May 30, 2016, 11 pages.

*Primary Examiner* — Mark H Rinehart
*Assistant Examiner* — Kokou R Detse
(74) *Attorney, Agent, or Firm* — Lee, Hong, Degerman, Kang & Waimey

(57) ABSTRACT

A wireless device is disclosed. The wireless device includes an antenna configured to transmit and receive data over a first frequency band having a first transmit frequency band and a first receive frequency band and a second frequency band having a second transmit frequency band and a second receive frequency band, a plurality of band filters including a first band filter, wherein the first band filter corresponds to the first transmit frequency band and the second receive frequency band, wherein at least a portion of the first transmit frequency band overlaps the second receive frequency band, and a switch including a first switch configured to bifurcate a signal path of the first band filter into a (Continued)

signal path of the first transmit frequency band and a signal path of the second receive frequency band.

12 Claims, 7 Drawing Sheets

(51) Int. Cl.
    *H04B 1/00*     (2006.01)
    *H04L 5/00*     (2006.01)
    *H04W 72/04*     (2009.01)

(52) U.S. Cl.
    CPC ......... *H04L 5/001* (2013.01); *H04W 72/0453* (2013.01)

(58) Field of Classification Search
    USPC ........................................................ 370/278
    See application file for complete search history.

(56) References Cited

U.S. PATENT DOCUMENTS

| | | |
|---|---|---|
| 2013/0273860 A1 | 10/2013 | Pehlke |
| 2016/0020737 A1* | 1/2016 | Kong ................. H03F 3/19<br>455/73 |
| 2016/0126987 A1* | 5/2016 | Wloczysiak .......... H03F 1/0205<br>375/347 |
| 2016/0218436 A1* | 7/2016 | Rao ................. H01Q 15/244 |
| 2017/0318589 A1* | 11/2017 | Negus ................. H01Q 3/24 |

FOREIGN PATENT DOCUMENTS

| | | |
|---|---|---|
| WO | 2012109276 | 8/2012 |
| WO | 2014005061 | 1/2014 |

* cited by examiner

FIG. 2
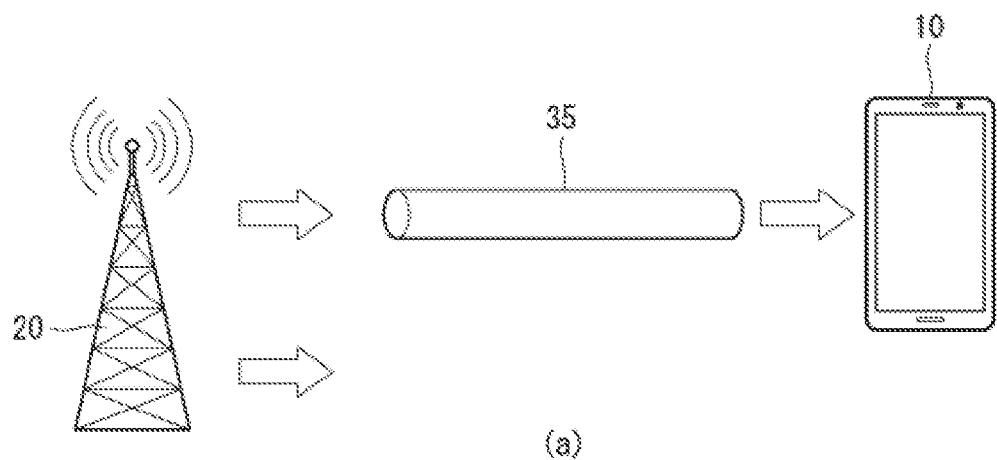
(a)
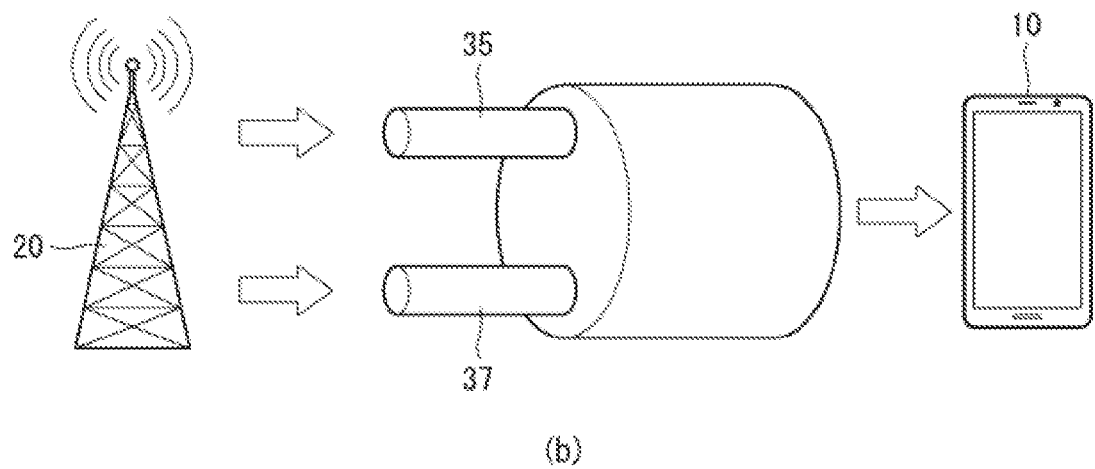
(b)

WIRELESS DEVICE

CROSS-REFERENCE TO RELATED APPLICATIONS

This application is the National Stage filing under 35 U.S.C. 371 of International Application No. PCT/KR2016/002033, filed on Feb. 29, 2016, which claims the benefit of earlier filing date and right of priority to Korean Application No. 10-2015-0086569, filed on Jun. 18, 2015, the contents of which are all hereby incorporated by reference herein in their entirety.

TECHNICAL FIELD

The present disclosure relates to a wireless device, and more particularly to a wireless device simultaneously generating carrier aggregation of first and third paths and carrier aggregation of second and fourth paths using one quadplexer.

BACKGROUND ART

A wireless device is capable of transmitting and receiving data for two-way communication. The wireless device may include a transmitter for data transmission and a receiver for data reception. For the data transmission, the transmitter may modulate a radio frequency (RF) signal with data to obtain a modulated RF signal, amplify the modulated RF signal to obtain an output RF signal having an appropriate output power, and transmit the output RF signal to a base station via an antenna. For the data reception, the receiver may obtain the RF signal received via the antenna and amplify and process the received RF signal to recover data transmitted by the base station.

DISCLOSURE

Technical Problem

An object of the present disclosure is to address the above-described and other problems. Another object of the present disclosure is to provide a wireless device capable of using an antenna without the separation and saving the cost of a quadplexer by simultaneously generating carrier aggregation of first and third paths and carrier aggregation of second and fourth paths using one quadplexer.

Technical Solution

In order to achieve the above-described and other objects, in one aspect of the present disclosure, there is provided a wireless device including an antenna configured to transmit and receive data over a first frequency band and a second frequency band, wherein the first frequency band has a first transmit frequency band and a first receive frequency band, and wherein a second frequency band has a second transmit frequency band and a second receive frequency band, a plurality of band filters including a first band filter, wherein the first band filter corresponds to the first transmit frequency band and the second receive frequency band, wherein at least a portion of the first transmit frequency band overlaps the second receive frequency band, and a switch including a first switch configured to bifurcate a signal path of the first band filter into a signal path of the first transmit frequency band and a signal path of the second receive frequency band.

The wireless device may further include a quadplexer connecting the antenna to the plurality of band filters, the quadplexer being configured to separate a signal into a transmit signal and a receive signal.

The quadplexer may separate the transmit and receive signals into four signals, of which at least a portion of frequency bands overlaps one another.

The quadplexer may be configured to simultaneously transmit the transmit and receive signals to a path from the quadplexer to the plurality of band filters, for carrier aggregation.

A path of the second receive frequency band may include a low-noise amplifier configured to amplify a signal passing through the first band filter, and a first receive band filter connected to the low-noise amplifier.

A path of the first transmit frequency band may include a first transmit band filter configured to filter a transmit signal.

The first transmit band filter may include at least one of a notch filter, a low-pass filter, and a high-pass filter.

A pass frequency band of the first band filter may be wider than the first transmit frequency band and the second receive frequency band.

The antenna transmit and receive data over the first and second frequency bands, a third frequency band, and a fourth frequency band, wherein the third frequency band has a third transmit frequency band and a third receive frequency band, and wherein the fourth frequency band has a fourth transmit frequency band and a fourth receive frequency band. The plurality of band filters may further include a second band filter which corresponds to the second transmit frequency band and the third receive frequency band, wherein at least a portion of the second transmit frequency band overlaps the third receive frequency band, a third band filter which corresponds to the first and fourth receive frequency bands, wherein at least a portion of the first receive frequency band overlaps the fourth receive frequency band, and a fourth band filter which corresponds to the third and fourth transmit frequency bands, wherein at least a portion of the third transmit frequency band overlaps the fourth transmit frequency band.

The switch may further include a second switch configured to bifurcate a signal path of the second band filter into a control path of the second transmit frequency band and a path of the third receive frequency band.

Paths of the first to fourth receive frequency bands may include a low-noise amplifier configured to amplify a signal passing through the first to third band filters, and first to third receive band filters connected to the low-noise amplifier.

Paths of the first and second transmit frequency bands may include first and second transmit band filters configured to filter a transmit signal.

Each of the first and second transmit band filters may include at least one of a notch filter, a low-pass filter, and a high-pass filter.

A pass frequency band of the first band filter may be wider than the first transmit frequency band and the second receive frequency band. A pass frequency band of the second band filter may be wider than the second transmit frequency band and the third receive frequency band.

The first to fourth transmit frequency bands may be separated from one another, and the first to fourth receive frequency bands may be separated from one another.

Advantageous Effects

An effect of a wireless device according to the present disclosure is described as follows.

According to at least one aspect of the present disclosure, the present disclosure has advantages in using an antenna without the separation and saving the cost of a quadplexer by simultaneously generating carrier aggregation of first and third paths and carrier aggregation of second and fourth paths using one quadplexer.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

DESCRIPTION OF DRAWINGS

FIG. 2 illustrates carrier aggregation of a wireless device.

MODE FOR INVENTION

Reference will now be made in detail to embodiments of the disclosure, examples of which are illustrated in the accompanying drawings. Wherever possible, the same reference numbers will be used throughout the drawings to refer to the same or like parts. In general, a suffix such as "module" and "unit" may be used to refer to elements or components. Use of such a suffix herein is merely intended to facilitate description of the specification, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Figure 1:
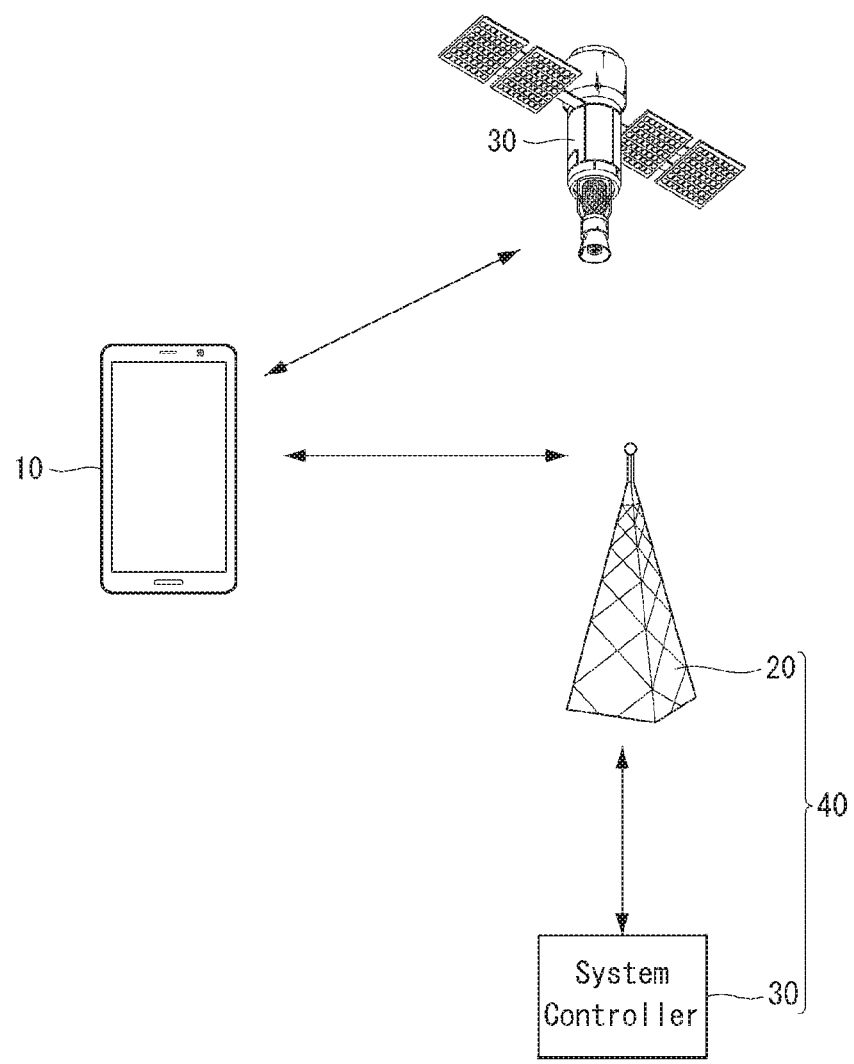
FIG. 1 illustrates a communication process of a wireless device related to an embodiment of the disclosure.

FIG. 1 illustrates a communication process of a wireless device related to an embodiment of the disclosure.

Communication systems may include Long Term Evolution (LTE) system, Code Division Multiple Access (CDMA) system, Global System for Mobile Communications (GSM) system, Wireless Local Area Network (WLAN) system, or other wireless systems. The CDMA system can implement Wideband CDMA (WCDMA), CDMA 1X, Time Division Synchronous CDMA (TD-SCDMA), or other versions of CDMA. FIG. 1 illustrates a communication system 40 including one base station 20 and one system controller 30. However, embodiments are not limited thereto. For example, the communication system 40 may include a plurality of base stations 20 and a plurality of network entities.

A wireless device 10 may be referred to as a user equipment (UE), a mobile terminal, an access terminal, a subscriber unit, a station, and the like. The wireless device 10 may be cellular phone, smart phone, tablet, wireless modem, personal digital assistant (PDA), handheld device, laptop computer, smart book, netbook, cordless phone, wireless local loop (WLL) station, Bluetooth device, and the like. The wireless device 10 may communicate with the communication system 40. The wireless device 10 may receive signals from the base stations 20 and receive signals from a satellite of at least one global navigation satellite system (GNSS). The wireless device 10 can support at least one radio technology for wireless communication such as LTE, WCDMA, CDMA 1X, TD-SCDMA, GSM, and 802.11.

The wireless device 10 may include at least one antenna. In the transmission, the antenna may convert a power high frequency energy of a transmitter into a radio frequency energy and radiate the radio frequency energy into a space. In the reception, the antenna may receive the radio frequency energy of the space, convert the radio frequency energy of the space into electric power, and supply the electric power to a receiving circuit.

FIG. 2 illustrates carrier aggregation of a wireless device.

The wireless device 10 can support carrier aggregation that is an operation on multiple carriers. The carrier aggregation may be a multi-carrier operation.

The wireless device 10 may operate at a low band of 698 to 960 MHz, a middle band of 1,710 to 2,170 MHz, and/or a high band of 2,300 to 2,690 MHz and 3,400 to 3,800 MHz. The low band, the middle band, and the high band may include a plurality of frequency bands.

The carrier aggregation may be a combination of two or more different frequency bands. When two or more different frequency bands are combined, a data rate can be improved compared to a frequency band used. Namely, the carrier aggregation means utilizing two or more different frequency bands together as if they were one band.

Referring to (a) of FIG. 2, the wireless device 10 not using the carrier aggregation may transmit data over only one band 35. When data is transmitted over only one band, other bands may be in a standby state. Hence, when data is transmitted over only one band, users may feel that a data rate is slow.

On the other hand, referring to (b) of FIG. 2, the wireless device 10 using the carrier aggregation may transmit data over one band 35 and another band 37. Hence, the two bands 35 and 37 can be utilized like one band. As a result, when the wireless device 10 uses the carrier aggregation, the users can feel that the data rate is increased in proportion to a frequency band used.

The carrier aggregation may be classified into intra-band carrier aggregation and inter-band carrier aggregation. The intra-band carrier aggregation may be an operation on multiple carriers within the same band. The inter-band carrier aggregation may be an operation on multiple carriers at different bands.

The wireless device 10 in intra-band contiguous carrier aggregation may be configured as four contiguous carriers at the same band. The wireless device 10 can transmit and/or receive data on multiple contiguous carriers within the same band.

The wireless device 10 in intra-band non-contiguous carrier aggregation may be configured as four non-contiguous carriers at the same band. The wireless device 10 can transmit and/or receive data on multiple non-contiguous carriers within the same band.

The wireless device 10 in the inter-band carrier aggregation can transmit and/or receive data on multiple carriers at different bands.

The embodiment of the disclosure described the intra-band carrier aggregation, by way of example. However, it is apparent that the embodiment of the disclosure can be applied to the inter-band carrier aggregation.

Figure 3:
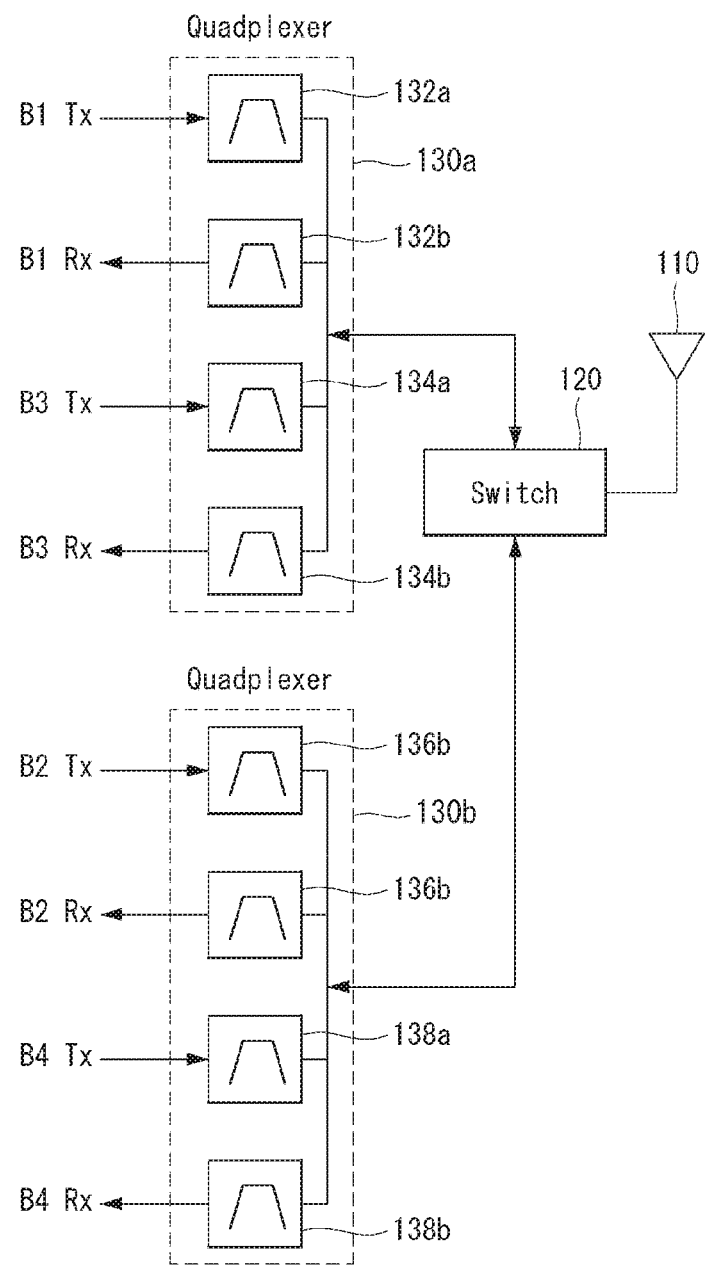
FIG. 3 is a flow chart illustrating a communication process of a wireless device according to a related art.

FIG. 3 is a flow chart illustrating a communication process of a wireless device according to a related art.

Referring to FIG. 3, a related art wireless device may include an antenna 110, a switch 120, first and second quadplexers 130a and 130b. The antenna 110 may receive signals from base stations and/or another transmitter and provide a received RF signal, in order to receive data. Further, the antenna 110 may convert a power high frequency energy received from an internal circuit into a radio frequency energy and radiate the radio frequency energy into a space. The antenna 110 may be connected to one end of the switch 120. The antenna 110 may transmit the signal through the switch 120.

The switch 120 may be connected to one end of the antenna 110. The switch 120 can be configured so that an RF signal of the antenna 110 is connected to only one of the first and second quadplexers 130a and 130b. Namely, the switch 120 can be configured so that the RF signal of the antenna 110 is connected to one quadplexer.

The first and second quadplexers 130a and 130b may separate the RF signal received from the antenna 110. More specifically, the first quadplexer 130a may separate the RF signal into B1 transmit and receive paths B1 Tx and B1 Rx and B3 transmit and receive paths B3 Tx and B3 Rx, and the second quadplexer 130b may separate the RF signal into B2 transmit and receive paths B2 Tx and B2 Rx and B4 transmit and receive paths B4 Tx and B4 Rx.

A bandpass filter may be positioned on each of the transmit and receive paths. The first quadplexer 130a may be connected to B1 transmit and receive bandpass filters 132a and 132b and B3 transmit and receive bandpass filters 134a and 132b, and the second quadplexer 130b may be connected to B2 transmit and receive bandpass filters 136a and 136b and B4 transmit and receive bandpass filters 138a and 138b. The bandpass filter can pass signals of a specific frequency band.

The wireless device according to the related art may require the two quadplexers 130a and 130b for bundling the transmit and receive bandpass filters together. Hence, the related art wireless device had a disadvantage of being very expensive.

Figure 4:
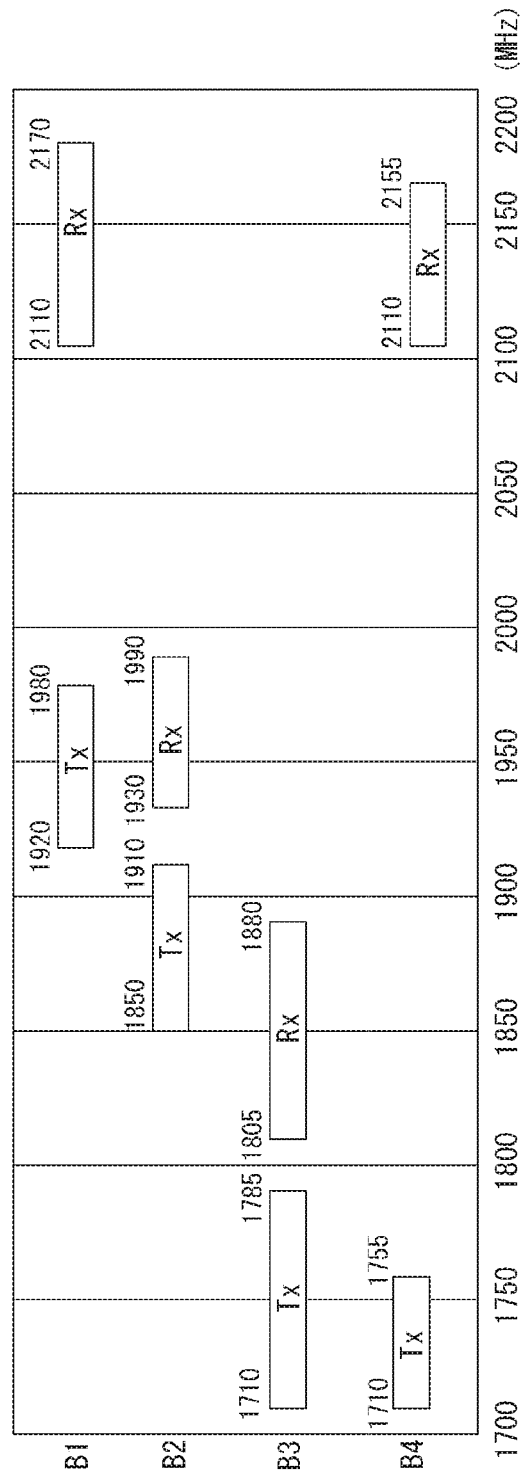
FIG. 4 illustrates transmit and receive frequencies according to an embodiment of the disclosure.

FIG. 4 illustrates transmit and receive frequencies according to an embodiment of the disclosure.

Referring to FIG. 4, in the wireless device according to the embodiment of the disclosure, the middle band may be divided into frequencies of B1 to B4 transmit and receive paths.

For example, the B1 transmit path B1 Tx may have a frequency band of 1,920 to 1,980 MHz, and the B1 receive path B1 Rx may have a frequency band of 2,110 to 2,170 MHz. For example, the B2 transmit path B2 Tx may have a frequency band of 1,850 to 1,910 MHz, and the B2 receive path B2 Rx may have a frequency band of 1,930 to 1,990 MHz. For example, the B3 transmit path B3 Tx may have a frequency band of 1,710 to 1,785 MHz, and the B3 receive path B3 Rx may have a frequency band of 1,805 to 1,880 MHz. For example, the B4 transmit path B4 Tx may have a frequency band of 1,710 to 1,755 MHz, and the B4 receive path B4 Rx may have a frequency band of 2,110 to 2,155 MHz.

In this instance, the B3 and B4 transmit paths B3 Tx and B4 Tx have the very similar frequency band and thus can use the same filter. In addition, the B1 and B4 receive paths B1 Rx and B4 Rx have the very similar frequency band and thus can use the same filter.

The frequency band of the B1 transmit path B1 Tx and the frequency band of the B2 receive path B2 Rx may overlap each other. However, when the B1 transmit path B1 Tx and the B2 receive path B2 Rx use the same filter, a performance of the filter for the B1 transmission and the B2 reception may be reduced due to an increase in the frequency band. Further, the frequency band of the B2 transmit path B2 Tx and the frequency band of the B3 receive path B3 Rx may overlap each other. However, when the B2 transmit path B2 Tx and the B3 receive path B3 Rx use the same filter, a performance of the filter for the B2 transmission and the B3 reception may be reduced due to an increase in the frequency band.

In addition, when the transmit path and the receive path use the same filter, one path may be divided into the transmit path and the receive path.

Figure 5:
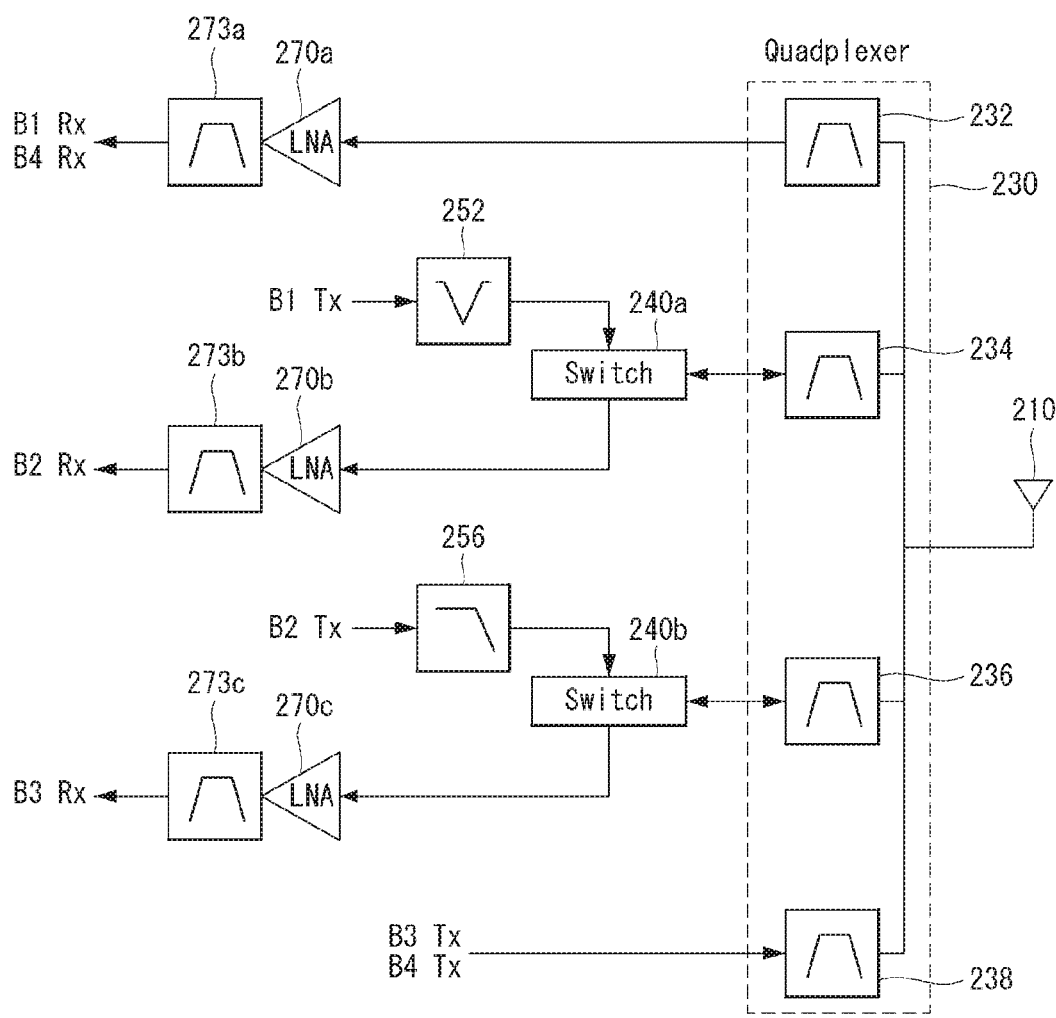
FIG. 5 is a flow chart illustrating a communication process of a wireless device according to an embodiment of the disclosure.

FIG. 5 is a flow chart illustrating a communication process of a wireless device according to an embodiment of the disclosure.

Referring to FIG. 5, a wireless device according to an embodiment of the disclosure may include an antenna 210, a quadplexer 230, and first and second switches 240a and 240b. The antenna 210 according to the embodiment of the disclosure may perform functions equal or similar to the antenna 110 according to the related art.

The quadplexer 230 may separate an RF signal received from the antenna 210. The quadplexer 230 may separate the RF signal into four paths having similar frequency bands. The quadplexer 230 may simultaneously receive signals from transmit paths and simultaneously transmit the signals to receive paths, in order to perform the carrier aggregation. A band filter may be connected to one end of the quadplexer 230. More specifically, the quadplexer 230 may be connected to a first band filter 234 passing a signal having frequency bands of B1 transmit path B1 Tx and B2 receive path B2 Rx, a second band filter 236 passing a signal having frequency bands of B2 transmit path B2 Tx and B3 receive path B3 Rx, a third band filter 232 passing a signal having frequency bands of B1 receive path B1 Rx and B4 receive path B4 Rx, and a fourth band filter 238 passing a signal having frequency bands of B3 transmit path B3 Tx and B4 transmit path B4 Tx.

Because the first band filter 234 has to pass all signals having the frequency bands of the B1 transmit path B1 Tx and the B2 receive path B2 Rx, the first band filter 234 can pass signals having a frequency band of 1,920 to 1,990 MHz. A pass frequency band, 1,920 to 1,990 MHz, of the first band filter 234 may include a frequency band, 1920 to 1980 MHz, of the B1 transmit path B1 Tx and a frequency band, 1,930 to 1,990 MHz, of the B2 receive path B2 Rx. Because the first band filter 234 uses one filter in the transmit path and the receive path, the path has to be divided.

Because the second band filter 236 has to pass all signals having the frequency bands of the B2 transmit path B2 Tx and the B3 receive path B3 Rx, the second band filter 236 can pass signals having a frequency band of 1,805 to 1,910 MHz. A pass frequency band, 1,805 to 1,910 MHz, of the second band filter 236 may include a frequency band, 1,850 to 1,910 MHz, of the B2 transmit path B2 Tx and a frequency band, 1,805 to 1,880 MHz, of the B3 receive path B3 Rx. Because the second band filter 236 uses one filter in the transmit path and the receive path, the path has to be divided.

Because the third band filter 232 has to pass all signals having the frequency bands of the B1 receive path B1 Rx and the B4 receive path B4 Rx, the third band filter 232 can pass signals having a frequency band of 2,110 to 2,170 MHz. A pass frequency band, 2,110 to 2,170 MHz, of the third band filter 232 may include a frequency band, 2,110 to 2,170 MHz, of the B1 receive path B1 Rx and a frequency band, 2,110 to 2,155 MHz, of the B4 receive path B4 Rx.

The fourth band filter 238 can signals having the frequency bands of the B3 transmit path B3 Tx and the B4 transmit path B4 Tx. A pass frequency band, 1,710 to 1,785 MHz, of the fourth band filter 238 may include a frequency band, 1,710 to 1,785 MHz, of the B3 transmit path B3 Tx and a frequency band, 1,710 to 1,755 MHz, of the B4 transmit path B4 Tx.

The first and second switches 240a and 240b may be positioned on a filter path, in order to separate the transmit path and the receive path of each of the first band filter 234 and the second band filter 236 from each other. The first and second switches 240a and 240b can be configured so that the signal is connected to only one of the transmit path and the receive path.

When a signal is transmitted to the first band filter 234 through a first transmit path B1 Tx, a first reception and a third reception may simultaneously occur. Hence, a notch filter 252 may be positioned on the first transmit path B1 Tx. The first band filter 234 cannot reject a first receive frequency of 2,110 to 2,170 MHz and a third receive frequency of 1,805 to 1,880 MHz. Hence, the notch filter 252 can be designed to reject 2,110 to 2,170 MHz and 1,805 to 1,880 MHz. As a result, a first transmit signal may not interfere with the first reception and the third reception.

When a signal is transmitted to the second band filter 236 through a second transmit path B2 Tx, a second reception and a fourth reception may simultaneously occur. Hence, a low-pass filter 256 may be positioned on the second transmit path B2 Tx. The second band filter 236 cannot reject a second receive frequency of 1,930 to 1,990 MHz and a fourth receive frequency of 2,110 to 2,170 MHz. Hence, the low-pass filter 256 can be designed to pass only frequencies equal to or less than 1,930 MHz. As a result, a second transmit signal may not interfere with the second reception and the fourth reception.

Performances of first to fourth receive paths B1 Rx to B4 Rx may be reduced because the pass frequencies of the first to third band filters 234, 236 and 232 are greater than frequencies of the first to fourth receive paths B1 Rx to B4 Rx. Further, because the switches are positioned on the second and third receive paths B2 Rx and B3 Rx, a signal loss may occur. Hence, low-noise amplifiers 270a to 270c are positioned on the first to fourth receive paths B1 Rx to B4 Rx and can compensate for the signal loss. The low-noise amplifiers 270a to 270c can function to reduce a noise and amplify the signal.

First to third receive band filters 273a to 273c may be connected to one ends of the low-noise amplifiers 270a to 270c. The first to third receive band filters 273a to 273c may pass only frequencies suitable for a frequency of the transmit path among signals passing through the low-noise amplifiers 270a to 270c. Hence, because frequencies suitable for the first to fourth receive paths B1 Rx to B4 Rx are received, interference between adjacent frequency bands can be prevented.

The wireless device according to the embodiment of the disclosure can manufacture a circuit using one quadplexer 230. Hence, the embodiment of the disclosure can reduce the manufacturing cost of the circuit. Further, the notch filter 252 and the low-pass filter 256 are positioned on the transmit path and thus can improve a transmit performance. In addition, the low-noise amplifiers 270a to 270c and the first to third receive band filters 273a to 273c are positioned on the receive path and thus can compensate for a reduction in a reception performance and the signal loss.

Figure 6:
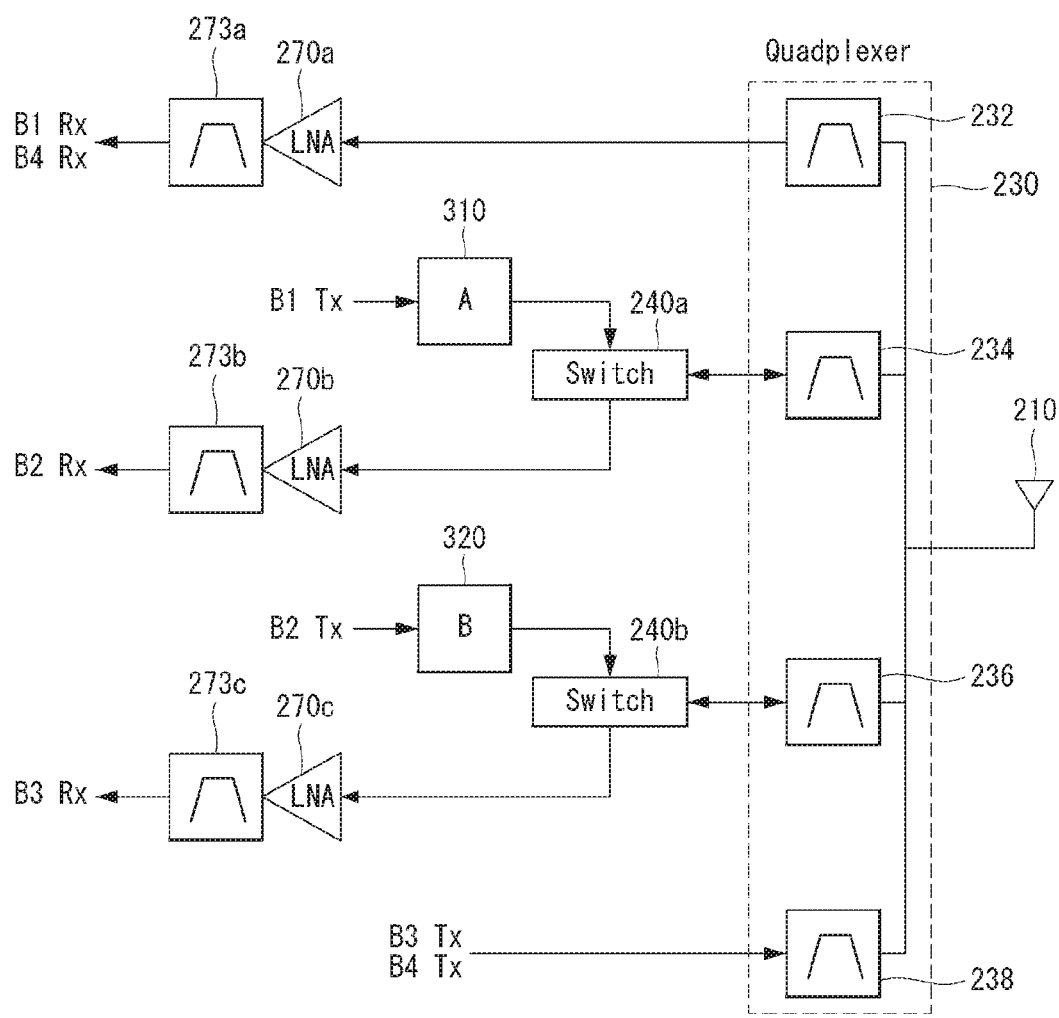
FIGS. 6 and 7 are flow charts illustrating a communication process of a wireless device according to another embodiment of the disclosure.
Figure 7:
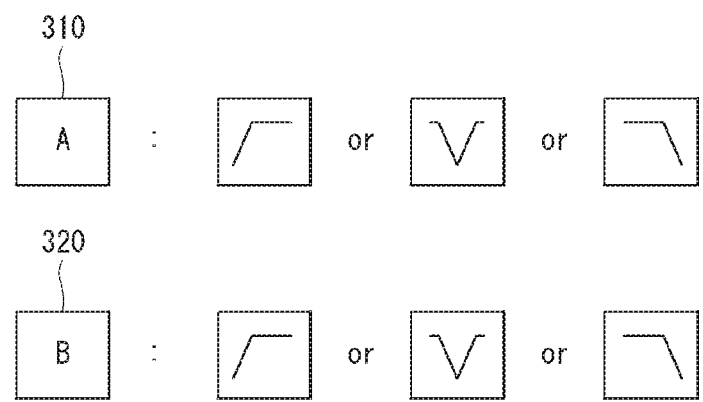

FIGS. 6 and 7 are flow charts illustrating a communication process of a wireless device according to another embodiment of the disclosure.

Referring to FIGS. 6 and 7, first and second transmit band filters 310 and 320 may be positioned on first and second transmit paths B1 Tx and B2 Tx. As shown in FIG. 7, the first and second transmit band filters 310 and 320 may include at least one of a high-pass filter, a notch filter, and a low-pass filter. The first and second transmit band filters 310 and 320 may be independent of each other and may not be related to each other. When a notch filter is positioned at the first transmit band filter 310, the notch filter can be designed to reject 2,110 to 2,170 MHz and 1,805 to 1,880 MHz as described above. However, embodiments are not limited thereto. For example, at least one of a notch filter, a high-pass filter, a low-pass filter, and a combination thereof may be positioned at the first transmit band filter 310 depending on a performance of a first band filter 234.

When a low-pass filter is positioned at the second transmit band filter 320, the low-pass filter can be designed to pass only frequencies equal to or less than 1,930 MHz as described above. However, embodiments are not limited thereto. For example, at least one of a notch filter, a high-pass filter, a low-pass filter, and a combination thereof may be positioned at the second transmit band filter 320 depending on a performance of a second band filter 236.

The wireless device according to the embodiment of the disclosure can simultaneously generate carrier aggregation of first and third paths and carrier aggregation of second and fourth paths using one quadplexer 230. Hence, the wireless device according to the embodiment of the disclosure can use the antenna 210 without the separation and save the cost of the quadplexer 230.

The foregoing embodiments are merely examples and are not to be considered as limiting the present disclosure. The present teachings can be readily applied to other types of methods and devices. The features, structures, methods, and other characteristics of the embodiments described herein may be combined in various ways to obtain additional and/or alternative embodiments.

The invention claimed is:

1. A wireless device comprising:
an antenna configured to transmit and receive data over a first frequency band a second frequency band, a third frequency band, and a fourth frequency band,
wherein the first frequency band has a first transmit frequency band and a first receive frequency band,
wherein a second frequency band has a second transmit frequency band and a second receive frequency band,
wherein the third frequency band has a third transmit frequency band and a third receive frequency band, and
wherein the fourth frequency band has a fourth transmit frequency band and a fourth receive frequency band,
wherein at least a portion of the second transmit frequency band overlaps the third receive frequency band,
wherein at least a portion of the first receive frequency band overlaps the fourth receive frequency band, and wherein at least a portion of the third transmit frequency band overlaps the fourth transmit frequency band, and wherein the first to fourth transmit frequency bands are separated from one another, and wherein the first to fourth receive frequency bands are separated from one another;

a plurality of band filters including a first band filter, wherein the first band filter corresponds to the first transmit frequency band and the second receive frequency band, and wherein at least a portion of the first transmit frequency band overlaps the second receive frequency band;

a switch including a first switch configured to bifurcate a signal path of the first band filter into a signal path of the first transmit frequency band and a signal path of the second receive frequency band; and a quadplexer connecting the antenna to the plurality of band filters, wherein the quadplexer located between the antenna and the switch is configured to separate a signal into a transmit signal and a receive signal, wherein the plurality of band filters further includes:
- a second band filter which corresponds to the second transmit frequency band and the third receive frequency band,
- a third band filter which corresponds to the first and fourth receive frequency bands; and
- a fourth band filter which corresponds to the third and fourth transmit frequency bands.

2. The wireless device of claim 1, wherein the quadplexer separates the transmit and receive signals into four signals, of which at least a portion of frequency bands overlaps one another.

3. The wireless device of claim 1, wherein the quadplexer is configured to simultaneously transmit the transmit and receive signals to a path from the quadplexer to the plurality of band filters, for carrier aggregation.

4. The wireless device of claim 1, wherein a path of the second receive frequency band includes:
- a low-noise amplifier configured to amplify a signal passing through the first band filter; and
- a first receive band filter connected to the low-noise amplifier.

5. The wireless device of claim 1, wherein a path of the first transmit frequency band includes a first transmit band filter configured to filter a transmit signal.

6. The wireless device of claim 5, wherein the first transmit band filter includes at least one of a notch filter, a low-pass filter, or a high-pass filter.

7. The wireless device of claim 1, wherein a pass frequency band of the first band filter is wider than the first transmit frequency band and the second receive frequency band.

8. The wireless device of claim 1, wherein the switch further includes:
- a second switch configured to bifurcate a signal path of the second band filter into a control path of the second transmit frequency band and a path of the third receive frequency band.

9. The wireless device of claim 1, wherein paths of the first to fourth receive frequency bands include:
- a low-noise amplifier configured to amplify a signal passing through the first to third band filters; and
- first to third receive band filters connected to the low-noise amplifier.

10. The wireless device of claim 1, wherein paths of the first and second transmit frequency bands include first and second transmit band filters configured to filter a transmit signal.

11. The wireless device of claim 10, wherein each of the first and second transmit band filters includes at least one of a notch filter, a low-pass filter, or a high-pass filter.

12. The wireless device of claim 1, wherein a pass frequency band of the first band filter is wider than the first transmit frequency band and the second receive frequency band, and wherein a pass frequency band of the second band filter is wider than the second transmit frequency band and the third receive frequency band.

\* \* \* \* \*